(12) United States Patent
Shelnutt et al.

(10) Patent No.: US 9,848,514 B2
(45) Date of Patent: Dec. 19, 2017

(54) SYSTEM AND METHOD FOR COOLING INFORMATION HANDLING RESOURCES

(71) Applicant: Dell Products L.P., Round Rock, TX (US)

(72) Inventors: Austin Shelnutt, Pflugerville, TX (US); Edmond Bailey, Cedar Park, TX (US); Richard Mills, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/146,777

(22) Filed: May 4, 2016

(65) Prior Publication Data

US 2016/0249486 A1    Aug. 25, 2016

Related U.S. Application Data

(62) Division of application No. 13/477,903, filed on May 22, 2012, now Pat. No. 9,354,676.

(51) Int. Cl.
*H05K 7/20* (2006.01)
*G06F 1/20* (2006.01)
*H01L 23/473* (2006.01)

(52) U.S. Cl.
CPC .......... *H05K 7/20772* (2013.01); *G06F 1/20* (2013.01); *G06F 2200/201* (2013.01); *H01L 23/473* (2013.01); *H01L 2924/0002* (2013.01); *Y10T 137/0402* (2015.04); *Y10T 137/598* (2015.04)

(58) Field of Classification Search
None
See application file for complete search history.

(56) References Cited

U.S. PATENT DOCUMENTS

| | | | | |
|---|---|---|---|---|
| 7,408,775 | B2 | 8/2008 | Walz | 165/104.33 |
| 7,450,385 | B1* | 11/2008 | Campbell | H05K 7/20781 165/80.4 |
| 8,018,718 | B2* | 9/2011 | Goth | F25B 49/02 165/80.3 |
| 8,305,754 | B2* | 11/2012 | Wu | H05K 7/20781 165/104.21 |
| 8,351,206 | B2* | 1/2013 | Campbell | H05K 7/20809 361/691 |
| 8,437,129 | B2* | 5/2013 | Tung | H05K 7/20772 165/80.4 |
| 2005/0047083 | A1* | 3/2005 | Kondo | G06F 1/20 361/689 |

(Continued)

*Primary Examiner* — Courtney Smith
(74) *Attorney, Agent, or Firm* — Baker Botts, L.L.P.

(57) ABSTRACT

A method may comprise causing a fluid to flow from a first fluidic column primary quick disconnect fluid fitting through a first fluidic column, the first fluidic column primary quick disconnect fluid fitting fluidically coupled to the first fluidic column and configured to couple to a first quick disconnect fluid fitting of a fluid network port. The method may also comprise causing the fluid to flow from the first fluidic column through at least one first fluidic column secondary quick disconnect fluid fitting having a fluidic network of corresponding information handling resource fluidically coupled thereto, the at least one first fluidic column secondary quick disconnect fluid fitting fluidically coupled to the first fluidic column and the fluidic network having one or more fluid conduits for conveying the fluid proximate to the information handling resource.

13 Claims, 3 Drawing Sheets

(56) References Cited

U.S. PATENT DOCUMENTS

| | | | | |
|---|---|---|---|---|
| 2007/0297136 A1* | 12/2007 | Konshak | ............ | H05K 7/20772 361/699 |
| 2013/0043775 A1* | 2/2013 | Chen | .................. | H05K 7/20781 312/236 |
| 2013/0106265 A1* | 5/2013 | Shelnutt | ............. | H05K 7/20254 312/236 |
| 2013/0112378 A1* | 5/2013 | Shelnutt | ............. | H05K 7/20781 165/121 |

* cited by examiner

SYSTEM AND METHOD FOR COOLING INFORMATION HANDLING RESOURCES

CROSS REFERENCES TO RELATED APPLICATIONS

This application is a divisional application of U.S. patent application Ser. No. 13/477,903 filed on May 22, 2012, the contents of which is incorporated herein by reference in its entirety for all purposes.

TECHNICAL FIELD

The present disclosure relates in general to cooling information handling resources, and more particularly to fluid cooling of individual components of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the capabilities of information handling systems have improved, the power requirements of information handling systems and their component information handling resources have increased. Accordingly, the amount of heat produced by such information handling resources have increased. Because the electrical properties of information handling resources may be adversely affected by the presence of heat (e.g., some information handling resources may not operate correctly outside of a particular range of temperatures), information handling systems often include cooling systems configured to cool such information handling resources.

Traditionally, information handling resources have been cooled via the impingement of air driven by one or more fans. As the density of information handling resources present in information handling systems have increased, and as information handling resources have become faster (and thus hotter), the airflow required to provide adequate cooling has increased, leading to the need for more powerful fans and/or greater numbers of fans. This leads to yet more power consumption, larger information handling system size, and excessive noise. In addition, because fans often transfer heat to those areas proximate to the information handling system being cooled, users of such information handling systems are often required to tolerate higher-than-typical temperatures.

SUMMARY

In accordance with the teachings of the present disclosure, the disadvantages and problems associated with cooling information handling resources have been substantially reduced or eliminated.

In accordance with embodiments of the present disclosure, a device may include a first fluidic column configured to conduct a fluid, a first fluidic column primary quick disconnect fluid fitting fluidically coupled to the first fluidic column and configured to couple to a first quick disconnect fluid fitting of a fluid network port, a plurality of first fluidic column secondary quick disconnect fluid fittings, each first fluidic column secondary quick disconnect fluid fitting fluidically coupled to the first fluidic column, a second fluidic column configured to conduct the fluid, a second fluidic column primary quick disconnect fluid fitting fluidically coupled to the second fluidic column and configured to couple to a second quick disconnect fluid fitting of the fluid network port, and a plurality of second fluidic column secondary quick disconnect fluid fittings, each second fluidic column secondary quick disconnect fluid fitting fluidically coupled to the second fluidic column, and each second fluidic column secondary quick disconnect fluid fitting having a corresponding first fluidic column secondary quick disconnect fluid fitting such that the first fluidic column secondary quick disconnect fluid fitting and its corresponding second fluidic column secondary quick disconnect fluid fitting are configured to couple to a fluidic network of an information handling resource, the fluid network comprising one or more fluid conduits for conveying a cooling fluid proximate to the information handling resource.

In accordance with these and other embodiments of the present disclosure, a system may include a chassis configured to receive a plurality of modular information handling resources, each modular information handling resource having a fluidic network of one or more fluid conduits for conveying a cooling fluid proximate to the information handling resource, and a cooling backplane mechanically coupled to the chassis. The cooling backplane may include a first fluidic column configured to conduct the cooling fluid, a first fluidic column primary quick disconnect fluid fitting fluidically coupled to the first fluidic column and configured to couple to a first quick disconnect fluid fitting of a fluid network port, a plurality of first fluidic column secondary quick disconnect fluid fittings, each first fluidic column secondary quick disconnect fluid fitting fluidically coupled to the first fluidic column, a second fluidic column configured to conduct the cooling fluid, a second fluidic column primary quick disconnect fluid fitting fluidically coupled to the second fluidic column and configured to couple to a second quick disconnect fluid fitting of the fluid network port; and a plurality of second fluidic column secondary quick disconnect fluid fittings, each second fluidic column secondary quick disconnect fluid fitting fluidically coupled to the second fluidic column, and each second fluidic column secondary quick disconnect fluid fitting having a corresponding first fluidic column secondary quick disconnect fluid fitting such that the first fluidic column secondary quick disconnect fluid fitting and its corresponding second fluidic column secondary quick disconnect fluid fitting are configured to couple to a fluidic network of a modular information handling resource engaged with the chassis.

In accordance with these and other embodiments of the present disclosure, a method comprising causing a fluid to flow from a first fluidic column primary quick disconnect fluid fitting through a first fluidic column, the first fluidic column primary quick disconnect fluid fitting fluidically coupled to the first fluidic column and configured to couple to a first quick disconnect fluid fitting of a fluid network port. The method may also include causing the fluid to flow from the first fluidic column through at least one first fluidic column secondary quick disconnect fluid fitting having a fluidic network of corresponding information handling resource fluidically coupled thereto, the at least one first fluidic column secondary quick disconnect fluid fitting fluidically coupled to the first fluidic column and the fluidic network having one or more fluid conduits for conveying the fluid proximate to the information handling resource. The method may additionally include causing the fluid to flow from the at least one first fluidic column secondary quick disconnect fluid fitting having the fluidic network of the information handling resource fluidically coupled thereto through the fluidic network of the information handling resource. The method may further include causing the fluid to flow from the fluidic network of the information handling resource through at least one second fluidic column secondary quick disconnect fluid fitting having the fluidic network of corresponding information handling resource fluidically coupled thereto. The method may also include causing the fluid to flow from the at least one second fluidic column secondary quick disconnect fluid fitting having the fluidic network of corresponding information handling resource fluidically coupled thereto through a second fluidic column, the at least one second fluidic column secondary quick disconnect fluid fitting fluidically coupled to the second fluidic column. The method may additional include causing the fluid to flow from the second fluidic column through a second fluidic column primary quick disconnect fluid fitting, the second fluidic column primary quick disconnect fluid fitting fluidically coupled to the second fluidic column and configured to couple to a second quick disconnect fluid fitting of the fluid network port.

Technical advantages of the present disclosure may be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
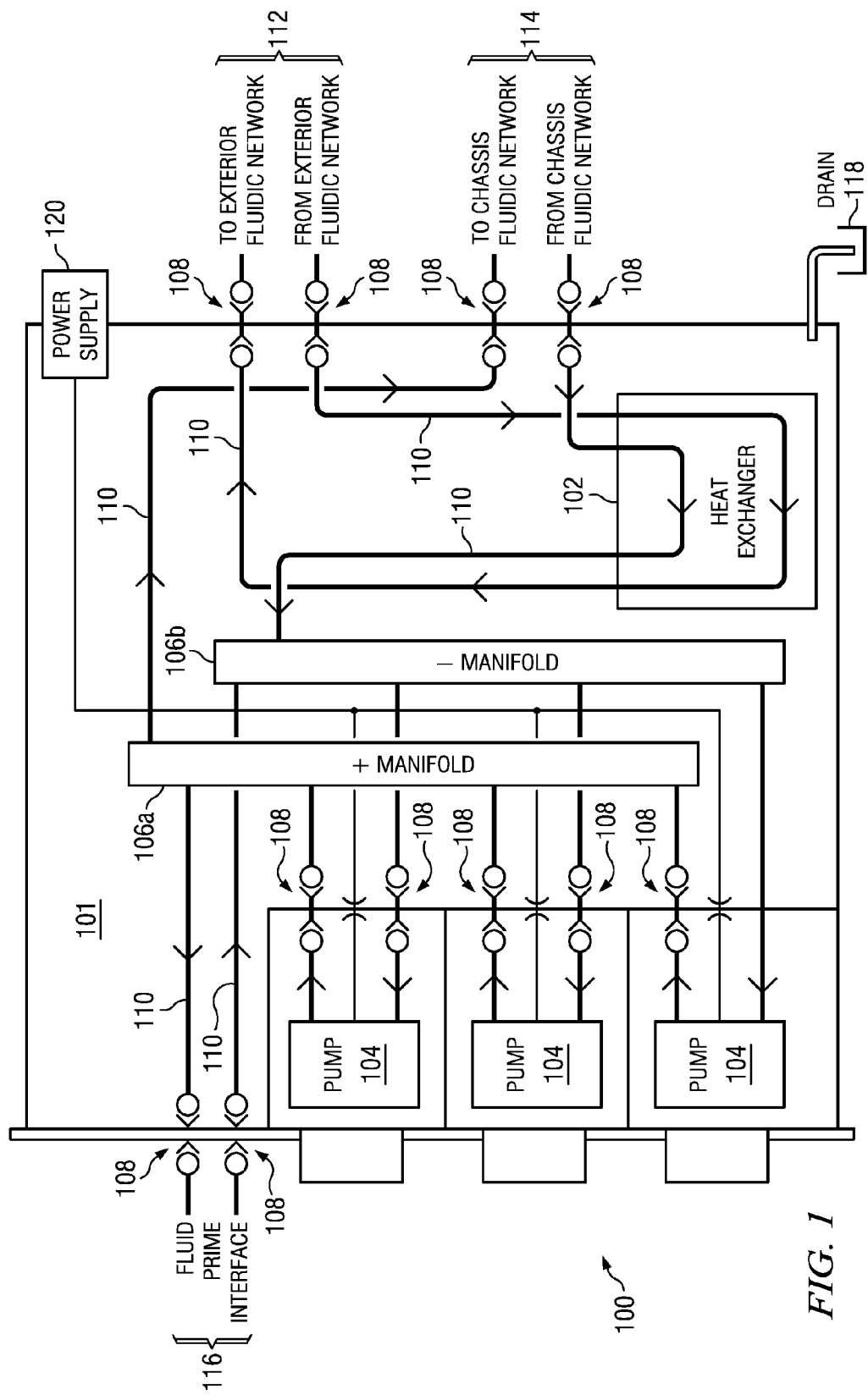
FIG. 1 illustrates an information handling system including a system for cooling of information handling resources, in accordance with embodiments of the present disclosure.
Figure 2:
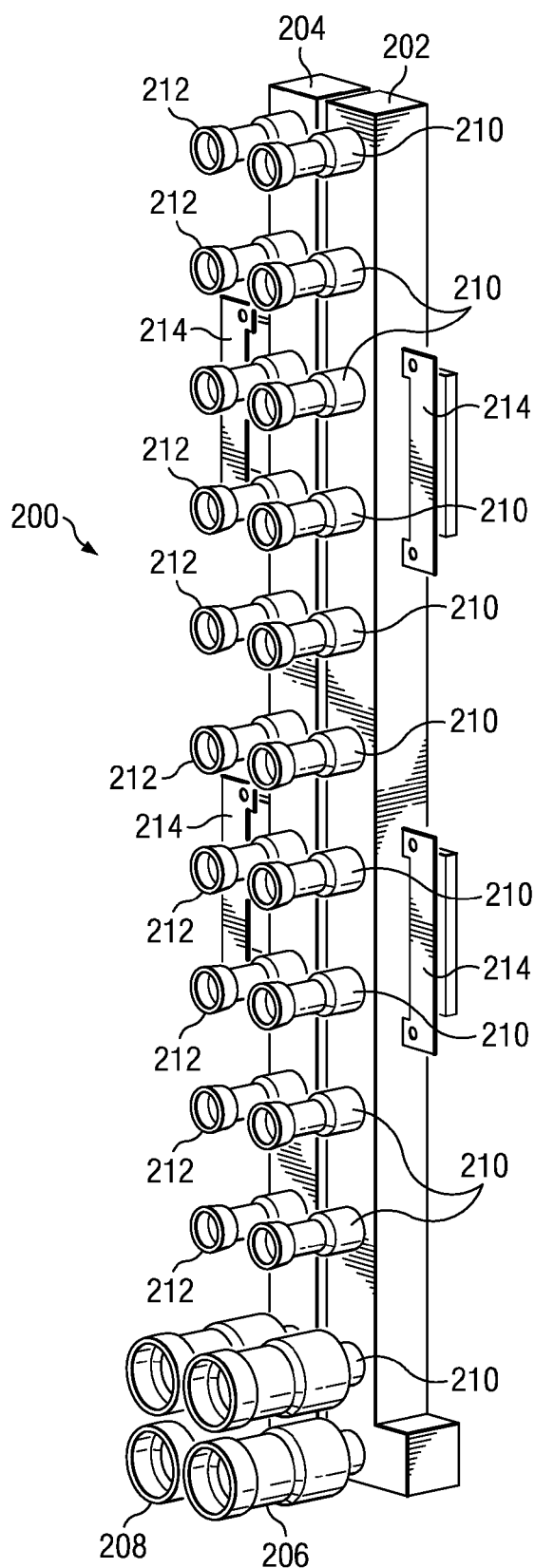
FIG. 2 illustrates a cooling backplane for a system of cooling information handling resources, in accordance with embodiments of the present disclosure.
Figure 3:
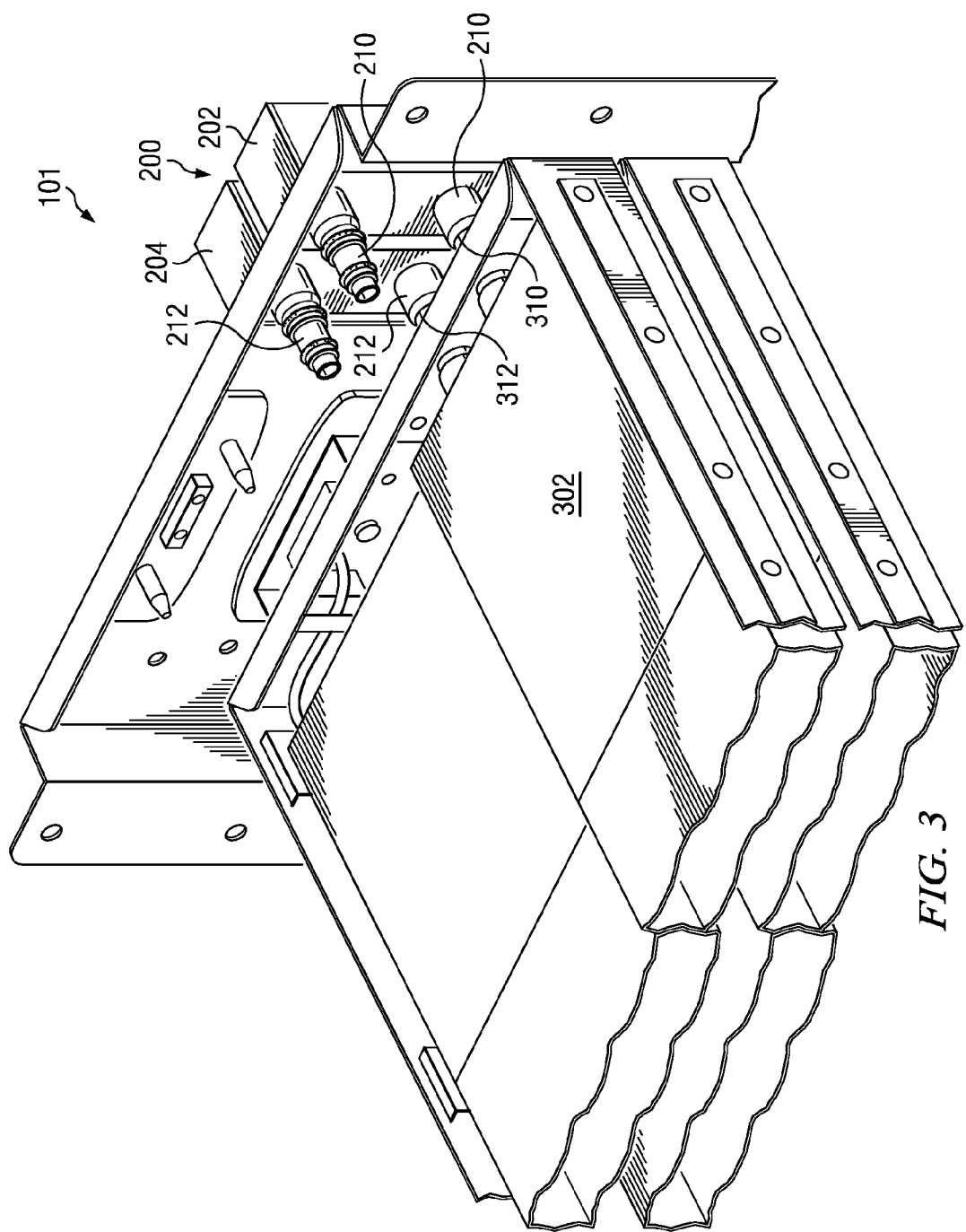
FIG. 3 illustrates selected components of a chassis comprising one or more information handling resources, in accordance with embodiments of the present disclosure.

Preferred embodiments and their advantages are best understood by reference to FIGS. 1-3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, fluid conduits or fluidic conduits may broadly refer to any device, system or apparatus for the conveyance of fluid (e.g., tubing, a pipe, a hollow cylinder, a channel, a microchannel, etc.).

For the purposes of this disclosure, an information handling resource may broadly refer to any component system, device or apparatus of an information handling system, including without limitation a processor, bus, memory, input-output device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

FIG. 1 illustrates an information handling system 100 including a system for cooling of information handling resources, in accordance with embodiments of the present disclosure. As shown in FIG. 1, information handling system 100 may include a chassis 101 housing a heat exchanger 102, one or more pumps 104, a positive manifold 106a, a negative manifold 106b, one or more quick disconnect fluid fittings 108, one or more fluidic conduits 110, a external fluid network port 112, a chassis fluid network port 114, a fluid prime interface 116, a drain 118, and a power supply 120. In addition, chassis 101 may house information handling resources and/or other components (not explicitly shown). Each of the various enumerated components of and other components chassis 101 may be modular, hot-pluggable, and hot-serviceable, such that during a failure or maintenance, such modular components may be, individually or in combination, removed without discharging and recharging cooling fluid in other components, and potentially without affecting operation of other components, thus potentially reducing downtime.

Chassis 101 may include any suitable enclosure for housing information handling resources. For example, chassis 101 may comprise a computer chassis or enclosure configured to hold one or more server blades. As another example, chassis 101 may comprise a storage enclosure configured to hold one or more storage resources (e.g., hard disk drives).

A heat exchanger 102 may comprise any system, device, or apparatus configured to transfer heat from one fluidic conduit to another fluidic conduit, thus cooling fluid present in the first fluidic conduit. In some embodiments, heat exchanger 102 may comprise a liquid-to-liquid heat exchanger.

A pump 104 may include any system, device, or apparatus configured to displace fluid from one fluidic conduit to another fluidic conduit. For example, as shown in FIG. 1, a pump 104 may displace fluid from negative manifold 106b to positive manifold 106a, and further displace fluid from positive manifold 106a to other fluidic components of information handling system 100. Each pump may be fluidically coupled to positive manifold 106 via a quick disconnect fluid fitting 108 and fluidically coupled to negative manifold 106 via a quick disconnect fluid fitting 108. As described below, such quick disconnect fluid fittings 108 may comprise no-drip valves, allowing each pump 104 to be hot pluggable into the fluidic network of information handling system 100, permitting redundancy and allowing replacement of a pump 104 without powering down information handling system 100 or discharging the fluid in the fluid network of information handling system 100.

Positive manifold 106a may comprise any fluidic conduit configured to redirect fluid received from one or more pumps 104 to a fluidic conduit for distribution to other fluidic components of information handling system 100. Similarly, negative manifold 106b may receive fluid from the fluidic system of information handling system 100, and, due to the fluid displacement caused by one or more pumps 104, deliver such fluid to the one or more pumps 104.

Throughout this disclosure, reference is made to various fluidic conduits 110 and/or fluidic components being coupled via quick disconnect fluid fittings. A quick disconnect fluid fitting 110 may be made from plastic, rubber, or other suitable material and may be any system, device or apparatus configured to couple fluidic channels 110 and/or components to one another to create a fluid seal that substantially prevents the leaking or dripping of any fluid at such points of coupling.

A fluidic conduits 110 may include any device, system or apparatus for the conveyance of fluid (e.g., tubing, a pipe, a hollow cylinder, a channel, a microchannel, etc.).

External fluidic network port 112 may include a plurality of quick disconnect fluid fittings 108 whereby fluidic conduits of information handling system 100 may be coupled to an external fluidic network. The external fluidic network may be configured to pump heated external network fluid from heat exchanger 102 (e.g., fluid to which heat has been transferred from chassis network fluid via liquid-to-liquid heat exchange in heat exchanger 102) to an external heat exchanger where such external network fluid is cooled so that it may cycle again to heat exchanger 102 to provide further cooling in chassis 101. In some embodiments, the external fluidic network may provide external network fluid to a plurality of information handling systems. Accordingly, the quick disconnect fluid fittings 108 of external fluidic network port 112 may, in such embodiments, be immediately coupled to the external fluidic network port 112 of another information handling system, thus permitting the information handling systems 100 to be fluidically coupled in series.

Chassis fluidic network port 114 may include a plurality of quick disconnect fluid fittings 108 whereby fluidic conduits 110 depicted in FIG. 1 may be coupled to a chassis fluidic network (not explicitly shown) of chassis 101 including other fluidic conduits 110 and/or other fluidic components carrying chassis network fluid and configured to transfer heat from information handling resources of information handling system 100 to the chassis network fluid, thus cooling such information handling resources.

Fluid prime interface 116 may include a plurality of quick disconnect fluid fittings 108 whereby fluid may be added to the chassis fluidic network of information handling system 100 in order to "charge" the fluidic conduits and components of information handling system with fluid. Similarly, drain 118 may provide a fluidic conduit whereby fluid may be drained to "discharge" the chassis fluidic network.

Power supply 120 may include any device, system, or apparatus operable to supply electrical energy to pumps 104 and/or other components of information handling system 100 via a power bus and/or any other suitable network of electrical conduits.

In operation, one or more pumps 104 may deliver chassis network fluid to positive manifold 106a. From positive manifold 106a, fluid may then travel (e.g., by displacement caused by one or more pumps 104) via chassis fluidic network port 114 to other portions of chassis 101, where heat from information handling resources may be transferred to the chassis network fluid. Chassis network fluid may return via chassis fluidic network port 114 and travel to heat exchanger 102, where it may transfer heat to external network fluid entering and exiting chassis 101 via external fluidic network port 112. From heat exchanger 102, cooled chassis network fluid may travel to negative manifold 106b, from which it may be distributed to the one or more pumps 104, where the process of communicating fluid may repeat itself.

In the embodiment shown in FIG. 1, the one or more pumps 104 received cooled chassis network fluid from heat exchanger 102. However, in other embodiments, the one or more pumps 104 may receive heated chassis network fluid from chassis fluidic network port 114 and displace such fluid to heat exchanger 102, where heat exchanger 102 may cool such chassis network fluid prior to the chassis network fluid being displaced to chassis fluidic network port 114 for distribution to other fluidic components of chassis 101.

FIG. 2 illustrates a cooling backplane 200 for use in system 100, in accordance with embodiments of the present disclosure. Cooling backplane 200 and/or its various components may be constructed from extruded aluminum, machined aluminum, case aluminum, and/or another suitable material. As shown in FIG. 2, cooling backplane 200 may comprise a first fluidic column 202, a second fluidic column 204, and mounting brackets 214. First fluidic column 202 may have coupled thereto a primary quick disconnect fluid fitting 206 and a plurality of secondary quick disconnect fluid fittings 210. Although depicted in FIG. 2 as being generally shaped as a rectangular cylinder, first fluidic column 202 may be shaped as a circular cylinder, elliptical cylinder, rectangular cylinder, triangular cylinder, or other suitable geometry. Thus, first fluidic column 202 may define a fluid conduit in its interior. As shown in FIG. 2, primary quick disconnect fluid fitting 206 and a secondary quick disconnect fluid fittings 210 may be aligned along the exterior of first fluidic column 202 in a substantially linear fashion (e.g., primary quick disconnect fluid fitting 206 and a secondary quick disconnect fluid fittings 210 are all approximately aligned along the same imaginary line). Primary quick disconnect fluid fitting 206 may be configured to mate with a corresponding quick disconnect fluid fitting 108 of chassis fluid network port 114. Each secondary quick disconnect fluid fitting 210 may be configured to mate with a corresponding quick disconnect fluid fitting 310 of an information handling resource 302 engaged with chassis 101, as shown in FIG. 3.

Similarly, second fluidic column 204 may have coupled thereto a primary quick disconnect fluid fitting 208 and a plurality of secondary quick disconnect fluid fittings 212. Although depicted in FIG. 2 as being generally shaped as a rectangular cylinder, second fluidic column 204 may be shaped as a circular cylinder, elliptical cylinder, rectangular cylinder, triangular cylinder, or other suitable geometry. Thus, second fluidic column 204 may define a fluid conduit in its interior. As shown in FIG. 2, primary quick disconnect fluid fitting 208 and a secondary quick disconnect fluid fittings 212 may be aligned along the exterior of second fluidic column 204 in a substantially linear fashion (e.g., primary quick disconnect fluid fitting 208 and a secondary quick disconnect fluid fittings 212 are all approximately aligned along the same imaginary line). Primary quick disconnect fluid fitting 208 may be configured to mate with a corresponding quick disconnect fluid fitting 108 of chassis fluid network port 114. Each secondary quick disconnect fluid fitting 212 may be configured to mate with a corresponding quick disconnect fluid fitting 312 of an information handling resource 302 engaged with chassis 101, as shown in FIG. 3.

Each bracket 214 may include one or more holes, openings, or apertures each configured to receive a screw, bolt, or other fastener for mechanically mounting cooling backplane 200 to chassis 101 such that quick disconnect fluid fittings 206, 208, 210, and 212 may interface with corresponding quick disconnect fluid fittings 108, 310, and 312, as appropriate, within the interior of chassis 101.

FIG. 3 illustrates selected components of chassis 101 comprising one or more information handling resources 302, in accordance with embodiments of the present disclosure. In operation, a user may engage a modular information handling resource 302 with chassis 101 (e.g., by sliding information handling resource 302 into an appropriate slot or drawer of chassis 101) or remove a modular information handling resource 302 with chassis 101 (e.g., by sliding information handling resource 302 out of an appropriate slot or drawer of chassis 101). As shown in FIG. 3, such an information handling resource 302 may include or have affixed thereto quick disconnect fluid fittings 310 and 312. Cooling backplane 200 and quick disconnect fluid fittings 310 and 312 may be configured such that when an information handling resource 302 is engaged with chassis 101: (i) a quick disconnect fluid fitting 210 may couple to a corresponding quick disconnect fluid fitting 310, thus providing a fluidic path between first fluidic column 202 and a fluidic network of the information handling resource; and (ii) a quick disconnect fluid fitting 212 may couple to a corresponding quick disconnect fluid fitting 312, thus providing a fluidic path between second fluidic column 204 and the fluidic network of the information handling resource. Upon removal of an information handling resource 302 from chassis 101, the quick disconnect fluid fittings 210, 212, 310, and 312 may disengage from each other, and close to prevent leakage of cooling fluid from both the fluidic network of the information handling resource 302 and cooling backplane 200.

Because quick disconnect fluid fittings 206 and 208 are coupled to chassis fluid network port 114, the fluid conduit within first fluidic column 202 may have a higher fluid pressure than that of the fluid conduit within second fluidic column 204 due to pressures created by pumps 104. Such difference in fluid pressure may induce a flow of fluid from chassis fluid network port 114 through primary quick disconnect fluid fitting 206 into first fluidic column 202. From first fluidic column 202, fluid may flow through secondary quick disconnect fluid fittings 210 that have corresponding quick disconnect fluid fittings 310 coupled thereto. Fluid may flow from quick disconnect fluid fittings 310 through fluidic networks of individual information handling resources 302 engaged with chassis 101 where heat may be exchanged from the information handling resources to the fluid. Fluid may then flow from such fluidic networks of individual information handling resources 302 engaged with chassis 101 into quick disconnect fluid fittings 312 of such information handling resources. Fluid may subsequently flow to second fluidic column 204 via secondary quick disconnect fluid fittings 212 that have corresponding quick disconnect fluid fittings 312 coupled thereto. From second fluidic column 212, fluid may return to chassis fluid network port 114 via primary quick disconnect fluid fitting 208. After returning to chassis fluid network port 114, the fluid may be cooled by heat exchanger 102 and recirculated to cooling backplane 200 by pumps 104.

Although the present disclosure has been described in detail, it should be understood that various changes, substitutions, and alterations can be made hereto without departing from the spirit and the scope of the disclosure as defined by the appended claims.

What is claimed is:

1. A system comprising:
   a chassis configured to receive a plurality of modular information handling resources, each modular information handling resource having a respective fluidic network of one or more fluid conduits for conveying a cooling fluid proximate to a respective one of the modular information handling resources;
   a cooling backplane mechanically coupled to the chassis and comprising:
      a first fluidic column;
      a first fluidic column primary quick disconnect fluid fitting fluidically coupled to the first fluidic column and to a first quick disconnect fluid fitting of a fluid network port;
      a plurality of first fluidic column secondary quick disconnect fluid fittings, each of the first fluidic column secondary quick disconnect fluid fittings fluidically coupled to the first fluidic column, the proximal sides of the first fluidic column secondary quick disconnect fluid fittings and first disconnect column primary quick disconnect fluid fitting abutting the exterior of the first fluidic column in a substantially linear fashion;
      a second fluidic column;
      a second fluidic column primary quick disconnect fluid fitting fluidically coupled to the second fluidic column and to a second quick disconnect fluid fitting of the fluid network port; and
      a plurality of second fluidic column secondary quick disconnect fluid fittings, each of the second fluidic column secondary quick disconnect fluid fittings fluidically coupled to the second fluidic column, and each of the second fluidic column secondary quick disconnect fluid fittings having a corresponding first fluidic column secondary quick disconnect fluid fitting such that the first fluidic column secondary quick disconnect fluid fitting and its corresponding second fluidic column secondary quick disconnect fluid fitting are coupled to the respective fluidic network of a modular information handling resource engaged with the chassis.

2. A system according to claim 1, further comprising at least one pump for inducing a fluid pressure on the cooling fluid, the at least one pump and the cooling backplane configured such that, under the influence of a fluid pressure differential between the first fluidic column and the second fluidic column induced by the at least one pump, the cooling fluid flows:

from the first fluidic column primary quick disconnect fluid fitting through the first fluidic column;

from the first fluidic column through at least one of the plurality of first fluidic column secondary quick disconnect fluid fittings;

from the at least one first fluidic column secondary quick disconnect fluid fitting through the fluidic network of the modular information handling resource coupled to the at least one of the plurality of first fluidic column secondary quick disconnect fluid fittings and its corresponding second fluidic column secondary quick disconnect fluid fitting;

from the fluidic network of the modular information handling resource through the corresponding second fluidic column secondary quick disconnect fluid fitting;

from the corresponding second fluidic column secondary quick disconnect fluid fitting through the second fluidic column; and from the second fluidic column through the second fluidic column primary quick disconnect fluid fitting.

3. A system according to claim 1, wherein the proximal sides of the second fluidic column secondary quick disconnect fluid fittings abut the exterior of the second fluidic column in a substantially linear fashion.

4. A system according to claim 1, wherein the proximal sides of the second fluidic column secondary quick disconnect fluid fittings and second fluidic column primary quick disconnect fluid fitting abut the exterior of the second fluidic column in a substantially linear fashion.

5. A system according to claim 1, the first fluidic column having the shape of one of a circular cylinder, an elliptical cylinder, a rectangular cylinder, and a triangular cylinder.

6. A system according to claim 1, the second fluidic column having the shape of one of a circular cylinder, an elliptical cylinder, a rectangular cylinder, and a triangular cylinder.

7. A system according to claim 1, the cooling backplane further comprising at least one bracket mechanically coupled to at least one of the first column and the second column and configured to mechanically couple the cooling backplane to the chassis.

8. A method comprising: causing a fluid to flow from a first fluidic column primary quick disconnect fluid fitting through a first fluidic column, the first fluidic column primary quick disconnect fluid fitting fluidically coupled to a first quick disconnect fluid fitting of a fluid network port; causing the fluid to flow from the first fluidic column through a first fluidic column secondary quick disconnect fluid fitting among a plurality of first fluidic column secondary quick disconnect fluid fittings fluidically coupled to the first fluidic column, wherein the proximal sides of the first fluidic column secondary quick disconnect fluid fitting and the first disconnect column primary quick disconnect fluid fitting abut the exterior of the first fluidic column in a substantially linear fashion, each of the first fluidic column secondary quick disconnect fluid fittings has a corresponding second fluidic column secondary quick disconnect fluid fitting such that the first fluidic column secondary quick disconnect fluid fitting and its corresponding second fluidic column secondary quick disconnect fluid fitting are coupled to a respective fluidic network of a modular information handling resource, and the fluidic network of the modular information handling resource has one or more fluid conduits for conveying a cooling fluid proximate to the modular information handling resource; causing the fluid to flow from the first fluidic column secondary quick disconnect fluid fitting through the fluidic network of the modular information handling resource; the fluid to flow from the fluidic network of the modular information handling resource through the corresponding second fluidic column secondary quick disconnect fluid fitting; causing the fluid to flow from the corresponding second fluidic column secondary quick disconnect fluid fitting through a second fluidic column; and causing the fluid to flow from the second fluidic column through a second fluidic column primary quick disconnect fluid fitting, the second fluidic column primary quick disconnect fluid fitting fluidically coupled to a second quick disconnect fluid fitting of the fluid network port.

9. A method according to claim 8, wherein the proximal sides of the second fluidic column secondary quick disconnect fluid fittings abut the exterior of the second fluidic column in a substantially linear fashion.

10. A method according to claim 8, wherein the proximal sides of the second fluidic column secondary quick disconnect fluid fittings and second fluidic column primary quick disconnect fluid fitting abut the exterior of the second fluidic column in a substantially linear fashion.

11. A method according to claim 8, the first fluidic column having the shape of one of a circular cylinder, an elliptical cylinder, a rectangular cylinder, and a triangular cylinder.

12. A method according to claim 8, the second fluidic column having the shape of one of a circular cylinder, an elliptical cylinder, a rectangular cylinder, and a triangular cylinder.

13. A method according to claim 8, further comprising coupling the first fluidic column and the second fluidic column to a chassis configured to receive a plurality of information handling resources.

* * * * *